US012781343B2

(12) United States Patent
Arkles et al.

(10) Patent No.: US 12,781,343 B2
(45) Date of Patent: Nov. 3, 2026

(54) METHOD FOR TUNGSTEN-BASED THIN FILM DEPOSITION VIA FABRICATION AND DECOMPOSITION OF PRECURSOR METASTABLE COMPLEXES (MOLECULAR SPECIES)

(71) Applicant: KALARK NANOSTRUCTURE SCIENCES INC., Doylestown, PA (US)

(72) Inventors: Barry C. Arkles, Pipersville, PA (US); Alain E. Kaloyeros, Slingerlands, NY (US)

(73) Assignee: KALARK NANOSTRUCTURE SCIENCES INC., Doylestown, PA (US)

(*) Notice: Subject to any disclaimer, the term of this patent is extended or adjusted under 35 U.S.C. 154(b) by 0 days.

(21) Appl. No.: 19/430,763

(22) Filed: Dec. 23, 2025

(65) Prior Publication Data

US 2026/0132506 A1 May 14, 2026

Related U.S. Application Data

(63) Continuation of application No. 19/385,565, filed on Nov. 11, 2025.

(Continued)

(51) Int. Cl.

| | |
|---|---|
| *C23C 16/52* | (2006.01) |
| *C23C 16/448* | (2006.01) |
| *C23C 16/455* | (2006.01) |

(52) U.S. Cl.

CPC .... *C23C 16/4488* (2013.01); *C23C 16/45536* (2013.01); *C23C 16/45553* (2013.01); *C23C 16/52* (2013.01)

(58) Field of Classification Search

CPC .......... C23C 16/4488; C23C 16/45536; C23C 16/45553; C23C 16/52

See application file for complete search history.

(56) References Cited

U.S. PATENT DOCUMENTS

| | | | | |
|---|---|---|---|---|
| 6,540,838 B2 | 4/2003 | Sneh et al. | | |
| 2003/0198587 A1* | 10/2003 | Kaloyeros | C01B 21/062 | 427/255.394 |

(Continued)

FOREIGN PATENT DOCUMENTS

| | | | |
|---|---|---|---|
| EP | 1156511 A1 | 11/2001 | |
| WO | WO-2020027921 A1 * | 2/2020 | C23C 16/16 |

OTHER PUBLICATIONS

Int'l Search Report and Written Opinion issued Mar. 20, 2026 in Int'l Application No. PCT/US2025/054099.

(Continued)

*Primary Examiner* — Hai Y Zhang

(74) *Attorney, Agent, or Firm* — Panitch Schwarze Belisario & Nadel LLP

(57) ABSTRACT

A method and system are provided for the low temperature deposition of tungsten (W) and W-based thin films through the planned and engineered ex-situ or in-situ creation of vapor phase metastable clusters or metastable complexes to achieve precise film conformality, composition, morphology, structure, and thickness. The tungsten based thin film deposition techniques include chemical vapor deposition (CVD), atomic layer deposition (ALD), pulsed CVD, molecular layer deposition (MLD), self-assembled monolayer (SAM) deposition, and Click chemistry deposition (CCD).

7 Claims, 3 Drawing Sheets

Related U.S. Application Data

(60) Provisional application No. 63/719,152, filed on Nov. 12, 2024.

(56) References Cited

U.S. PATENT DOCUMENTS

| | | | |
|---|---|---|---|
| 2019/0112709 | A1 | 4/2019 | Arkles et al. |
| 2021/0140036 | A1 | 5/2021 | Arkles et al. |
| 2022/0017554 | A1 | 1/2022 | Yoshino et al. |

OTHER PUBLICATIONS

Office Action and Search Report issued Jun. 15, 2026 in TW Application No. 114143759, with partial English language translation.

* cited by examiner

METHOD FOR TUNGSTEN-BASED THIN FILM DEPOSITION VIA FABRICATION AND DECOMPOSITION OF PRECURSOR METASTABLE COMPLEXES (MOLECULAR SPECIES)

CROSS-REFERENCE TO RELATED APPLICATION

This application is a continuation of co-pending U.S. patent application Ser. No. 19/385,565, filed Nov. 11, 2025, which claims priority to U.S. Provisional Patent Application No. 63/719,152, filed Nov. 12, 2024, the disclosures of which are herein incorporated by reference in their entirety.

BACKGROUND OF THE INVENTION

Aspects of the disclosure relate to methods for tungsten (W) based thin film deposition, including chemical vapor deposition (CVD), atomic layer deposition (ALD), pulsed CVD, molecular layer deposition (MLD), self-assembled monolayer (SAM) deposition, and Click chemistry deposition (CCD) that allow the growth of W-based thin films onto a substrate with exact composition, morphology, structure, and thickness through regulated fabrication and decomposition of precursor metastable clusters or metastable complexes either in the vapor phase or on the substrate surface. Analogous molybdenum-based and ruthenium-based thin film depositions are also part of this invention.

The ever-increasing drive toward smaller, denser, and more functional semiconductor and hetero-device structures is requiring significant reduction in the thermal budget involved in the various processing steps necessary to grow such structures. This reduction is mandated not only by the thermally fragile nature of the constantly decreasing thicknesses of the various thin film building blocks of such structures, but also by the use of new elements in semiconductor architectures, multi-element compounds, and highly doped materials that are thermally fragile and can lose their integrity, alter their properties and performance, and/or react undesirably with the surrounding substructures. Additionally, the introduction of more flexible, typically carbon-based, substrates, such as plastic or polymer substrates, further strains processing temperatures.

In such critical applications, chemical vapor deposition of tungsten and its nitride (WN), carbide (WC), carbo-nitride (WCN), and oxide (WO) has become an essential building block in achieving performance improvement in metal oxide semiconductor field effect transistors by acting as excellent plug contact (W) between the transistor and first metallization level, as well as diffusion barrier, encapsulation layer, and adhesion promoters (WN and WC) for copper (Cu) and cobalt (Co) interconnects. However, the introduction of chemically and thermally fragile dielectrics in emerging generations of integrated circuitry (IC) applications requires lowering the CVD tungsten processing temperatures below 600° C. and preventing the incorporation of any halide from the tungsten source precursors to minimize or eliminate undesirable halide-induced reactions and/or the incorporation of halides into the metal or dielectric layers.

A further advantage for IC technologies is that tungsten thin films can act as interconnect metal and as electrical wiring in nanoscale multi-level metallization schemes where the physical phenomenon known as surface scattering, which occurs when via and trench dimensions approach the electronic mean free path for scattering, causes Cu and Co line resistivity to increase and approach that of W. This behavior makes W, which is more mechanically and chemically robust and exhibits a stronger resistance to oxidation than Cu and Co, a viable candidate as the interconnect metal of choice in nanoscale device structures. These commercial opportunities have spawned tremendous interest not only in optimizing and understanding W film growth processes and resulting properties, but also in expanding its use in future IC products.

Other uses of metallic W and W-containing films (such as oxides, carbides, and nitrides) include: (i) the use of W oxides in various tungsten oxidation states for metal-oxide-semiconductor (MOS) sensing systems, photodetectors, electrochromic and supercapacitive devices, memristors and electrolyte-gated transistors, (ii) the use of WN in wear resistance and hard protective coatings as well as agents for photoelectrochemical hydrogen generation, catalysts for nitrogen monoxide dissociation and reduction by hydrogen, and deuterium diffusion barriers in fusion plasma-facing components in nuclear systems; (iii) the use of WC in wear-resistant protective coatings for mechanical parts, molds, and drilling tools; and (iv) the use of WCN as a catalyst for hydrazine decomposition.

Accordingly, it would be highly desirable to provide a low temperature process for the deposition of W and W-based thin films through the planned and engineered creation of vapor phase metastable clusters or metastable complexes to achieve precise film conformality, composition, morphology, structure, and thickness.

SUMMARY OF THE INVENTION

In one embodiment, aspects of the disclosure relate to a method for depositing a tungsten-based thin film onto a substrate, the method comprising:

- providing a substrate in a deposition chamber, wherein the deposition chamber has walls;
- heating the substrate to about 100° C. to about 650° C.;
- maintaining the substrate at about 100° C. to about 650° C.;
- providing a synthesis chamber which is distinct from the deposition chamber, wherein the synthesis chamber has walls;
- connecting the synthesis chamber to the deposition chamber via a vacuum interlock or valving system;
- heating the walls of the synthesis chamber to about 50° C. to about 500° C.;
- providing a tungsten source precursor to the synthesis chamber;
- generating vapor phase molecular complexes from the tungsten source precursor while maintaining the temperature of the walls of the synthesis chamber walls at about 50° C. to about 500° C.;
- controlling a concentration or partial pressure of the vapor phase metastable complexes in the synthesis chamber using a vacuum, inert gas, or a stabilizing gas to prevent self-reaction of the vapor phase metastable complexes; and
- delivering the vapor phase metastable complexes to the deposition chamber, where the vapor phase metastable complexes decompose to form a tungsten-based thin film on the substrate by:

(a) maintaining the partial pressure of the vapor phase metastable complexes in the deposition chamber at about 1 to about 500 Torr while maintaining the walls of the deposition chamber at about 50° C. to about 350° C.; or (b) maintaining the partial pressure of the vapor phase metastable complexes in the deposition chamber at about 0.01 to about 10 Torr while maintaining the walls of the deposition chamber walls at about 350° C. to about 500° C.

In a second embodiment, aspects of the disclosure are directed to a method for depositing a tungsten-based thin film onto a substrate, the method comprising:

providing a substrate in a deposition chamber, wherein the deposition chamber has walls;

heating the substrate to about 100° C. to about 650° C.;

maintaining the substrate at about 100° C. to about 650° C.;

providing a synthesis chamber which is distinct from the deposition chamber, wherein the synthesis chamber has walls;

connecting the synthesis chamber to the deposition chamber via a vacuum interlock or valving system;

maintaining the walls of the synthesis chamber at room temperature;

providing a tungsten source precursor to the synthesis chamber;

forming a direct or remote soft plasma in the synthesis chamber with a plasma power density of about 0.01 $W/cm^2$ to about 25 $W/cm^2$ to remove one or more source precursor ligands or molecular groups from the tungsten source precursor to form metastable complexes without completely decomposing the tungsten source precursor;

controlling a concentration or partial pressure of the vapor phase metastable complexes in the synthesis chamber using a vacuum, inert gas, or a stabilizing gas to prevent self-reaction of the vapor phase metastable complexes; and delivering the vapor phase metastable complexes to the deposition chamber, where the vapor phase metastable complexes decompose to form a tungsten-based thin film on the substrate by:

(a) forming a direct or remote soft plasma in the deposition chamber with a plasma power density of about 5 $W/cm^2$ to about 25 $W/cm^2$ while maintaining the walls of the deposition chamber walls at about 50° C. to about 250° C.; or (b) forming a direct or remote soft plasma in the deposition chamber with a plasma power density of about 0.01 $W/cm^2$ to about 5 $W/cm^2$ while maintaining the walls of the deposition chamber at about 250° C. to about 500° C.

Further aspects of the disclosure relate to a method for depositing a tungsten-based thin film onto a substrate, the method comprising:

providing a substrate in a deposition chamber, wherein the deposition chamber has walls;

heating the substrate to about 100° C. to about 650° C.;

maintaining the substrate at about 100° C. to about 650° C.;

providing a vacuum manifold and a pumping system to the deposition chamber to maintain pressure in the deposition chamber;

providing a tungsten source precursor to the deposition chamber;

generating vapor phase molecular complexes from the tungsten source precursor;

generating a concentration or partial pressure of the vapor phase metastable complex in the deposition chamber using a vacuum, inert gas, or a stabilizing gas to prevent self-reaction of the vapor phase metastable complexes by:

(a) maintaining the partial pressure of the vapor phase metastable complexes in the deposition chamber at about 10 to about 250 Torr while maintaining the walls of the deposition chamber at about 50° C. to about 250° C.; or (b) maintaining the partial pressure of the vapor phase metastable complexes in the deposition chamber at about 0.01 to about 10 Torr while maintaining the walls of the deposition chamber walls at about 250° C. to about 500° C.;

wherein the vapor phase metastable complexes adsorb onto the substrate surface and decompose, thus depositing a tungsten-based thin film on the substrate.

Further aspects of the disclosure relate to a method for depositing a tungsten-based thin film onto a substrate, the method comprising:

providing a substrate in a deposition chamber, wherein the deposition chamber has walls;

heating the substrate to about 100° C. to about 650° C.;

maintaining the substrate at about 100° C. to about 650° C.;

providing a vacuum manifold and a pumping system to the deposition chamber to maintain pressure in the deposition chamber;

providing a tungsten source precursor to the deposition chamber;

generating vapor phase molecular complexes from the tungsten source precursor;

generating a concentration or partial pressure of the vapor phase metastable complexes in the deposition chamber using a vacuum, inert gas, or a stabilizing gas to prevent self-reaction of the vapor phase metastable complexes by:

(a) forming a direct or remote soft plasma in the deposition chamber with a plasma power density of about 5 $W/cm^2$ to about 25 $W/cm^2$ while maintaining the walls of the deposition chamber walls at about 50° C. to about 250° C.; or (b) forming a direct or remote soft plasma in the deposition chamber with a plasma power density of about 0.01 $W/cm^2$ to about 5 $W/cm^2$ while maintaining the walls of the deposition chamber at about 250° C. to about 500° C.;

wherein the vapor phase metastable complexes adsorb onto the substrate surface and decompose, thus depositing a tungsten-based thin film on the substrate.

Advantageous refinements of the invention, which can be implemented alone or in combination, are specified in the dependent claims.

In summary, the following embodiments are proposed as particularly preferred in the scope of the present invention:

Embodiment 1: A method for depositing a tungsten-based thin film onto a substrate, the method comprising:

providing a substrate in a deposition chamber, wherein the deposition chamber has walls;

heating the substrate to about 100° C. to about 650° C.;

maintaining the substrate at about 100° C. to about 650° C.;

providing a synthesis chamber which is distinct from the deposition chamber, wherein the synthesis chamber has walls;

connecting the synthesis chamber to the deposition chamber via a vacuum interlock or valving system;

heating the walls of the synthesis chamber to about 50° C. to about 500° C.;

providing a tungsten source precursor to the synthesis chamber;

generating vapor phase molecular complexes from the tungsten source precursor while maintaining the temperature of the walls of the synthesis chamber walls at about 50° C. to about 500° C.;

controlling a concentration or partial pressure of the vapor phase metastable complexes in the synthesis chamber using a vacuum, inert gas, or a stabilizing gas to prevent self-reaction of the vapor phase metastable complexes; and delivering the vapor phase metastable complexes to the deposition chamber, where the vapor phase metastable complexes decompose to form a tungsten-based thin film on the substrate by:

(a) maintaining the partial pressure of the vapor phase metastable complexes in the deposition chamber at about 1 to about 500 Torr while maintaining the walls of the deposition chamber at about 50° C. to about 350° C.; or (b) maintaining the partial pressure of the vapor phase metastable complexes in the deposition chamber at about 0.01 to about 10 Torr while maintaining the walls of the deposition chamber walls at about 350° C. to about 500° C.

Embodiment 2: The method according to Embodiment 1, wherein the tungsten source precursor has a formal tungsten oxidation state of zero.

Embodiment 3: The method according to Embodiment 1 or 2, wherein the tungsten source precursor is selected from the group consisting of tungsten hexafluoride ($WF_6$), tungsten hexachloride ($WCl_6$), tungsten pentachloride ($WCl_5$); bis(tert-butylimido)bis(dimethylamido)tungsten $[(tBuN)_2(Me_2N)_2W]$; $W_2(NMe_2)_6$; tris(3-hexyne)tungsten carbonyl $[W(CO)(CH_3CH_2CCCH_2CH_3)_3]$; ethylcyclopentadienyl-tungsten(V)tricarbonylhydride ($HEtCpW(CO)_3$); tungsten ethoxide $W(OC\ (OC_2H_5))_6$; a tungsten pentacarbonyl dialkylamide $W(CO)_5{\cdot}NR_2$; and a tungsten pentacarbonyl trialkylamide $W(CO)_5{\cdot}NR_3$.

Embodiment 4: The method according to any of Embodiments 1 to 3, further comprising delivering hydrogen as a co-reactant to the synthesis and/or deposition chamber, optionally in combination with an inert gas.

Embodiment 5: The method according to any of Embodiments 1 to 3, further comprising delivering a nitrogen-containing gas as a co-reactant to the synthesis and/or deposition chamber, optionally in combination with an inert gas.

Embodiment 6: The method according to Embodiment 5, wherein the nitrogen containing gas is selected from the group consisting of ammonia and hydrogen azide.

Embodiment 7: The method according to any of Embodiments 1 to 6, wherein the method is selected from the group consisting of chemical vapor deposition, atomic layer deposition, molecular layer deposition, self-assembled monolayer deposition, and click chemistry deposition.

Embodiment 8: A method for depositing a tungsten-based thin film onto a substrate, the method comprising:

providing a substrate in a deposition chamber, wherein the deposition chamber has walls;

heating the substrate to about 100° C. to about 650° C.;

maintaining the substrate at about 100° C. to about 650° C.;

providing a synthesis chamber which is distinct from the deposition chamber, wherein the synthesis chamber has walls;

connecting the synthesis chamber to the deposition chamber via a vacuum interlock or valving system;

maintaining the walls of the synthesis chamber at room temperature;

providing a tungsten source precursor to the synthesis chamber;

forming a direct or remote soft plasma in the synthesis chamber with a plasma power density of about 0.01 W/cm$^2$ to about 25 W/cm$^2$ to remove one or more source precursor ligands or molecular groups from the tungsten source precursor to form metastable complexes without completely decomposing the tungsten source precursor;

controlling a concentration or partial pressure of the vapor phase metastable complexes in the synthesis chamber using a vacuum, inert gas, or a stabilizing gas to prevent self-reaction of the vapor phase metastable complexes; and delivering the vapor phase metastable complexes to the deposition chamber, where the vapor phase metastable complexes decompose to form a tungsten-based thin film on the substrate by:

(a) forming a direct or remote soft plasma in the deposition chamber with a plasma power density of about 5 W/cm$^2$ to about 25 W/cm$^2$ while maintaining the walls of the deposition chamber walls at about 50° C. to about 250° C.; or (b) forming a direct or remote soft plasma in the deposition chamber with a plasma power density of about 0.01 W/cm$^2$ to about 5 W/cm$^2$ while maintaining the walls of the deposition chamber at about 250° C. to about 500° C.

Embodiment 9: The method according to Embodiment 8, wherein the tungsten source precursor has a formal tungsten oxidation state of zero.

Embodiment 10: The method according to Embodiment 8 or 9, wherein the tungsten source precursor is selected from the group consisting of tungsten hexafluoride ($WF_6$), tungsten hexachloride ($WCl_6$), tungsten pentachloride ($WCl_5$); bis(tert-butylimido)bis(dimethylamido)tungsten $[(tBuN)_2(Me_2N)_2W]$; $W_2(NMe_2)_6$; tris(3-hexyne)tungsten carbonyl $[W(CO)(CH_3CH_2CCCH_2CH_3)_3]$; ethylcyclopentadienyl-tungsten(V)tricarbonylhydride ($HEtCpW(CO)_3$); tungsten ethoxide $W(OC\ (OC_2H_5))_6$; a tungsten pentacarbonyl dialkylamide $W(CO)_5{\cdot}NR_2$; and a tungsten pentacarbonyl trialkylamide $W(CO)_5{\cdot}NR_3$.

Embodiment 11: The method according to any of Embodiments 8 to 10, further comprising delivering hydrogen as a co-reactant to the synthesis and/or deposition chamber, optionally in combination with an inert gas.

Embodiment 12: The method according to any of Embodiments 8 to 10, further comprising delivering a nitrogen-containing gas as a co-reactant to the synthesis and/or deposition chamber, optionally in combination with an inert gas.

Embodiment 13: The method according to Embodiment 12, wherein the nitrogen containing gas is selected from the group consisting of ammonia and hydrogen azide.

Embodiment 14: A method for depositing a tungsten-based thin film onto a substrate, the method comprising:

providing a substrate in a deposition chamber, wherein the deposition chamber has walls;

heating the substrate to about 100° C. to about 650° C.;

maintaining the substrate at about 100° C. to about 650° C.;

providing a vacuum manifold and a pumping system to the deposition chamber to maintain pressure in the deposition chamber;

providing a tungsten source precursor to the deposition chamber;

generating vapor phase molecular complexes from the tungsten source precursor; and generating a concentration or partial pressure of the vapor phase metastable complex in the deposition chamber using a vacuum, inert gas, or a stabilizing gas to prevent self-reaction of the vapor phase metastable complexes by:

(a) maintaining the partial pressure of the vapor phase metastable complexes in the deposition chamber at about 10 to about 250 Torr while maintaining the walls of the deposition chamber at about 50° C. to about 250° C.; or (b) maintaining the partial pressure of the vapor phase metastable complexes in the deposition chamber at about 0.01 to about 10 Torr while maintaining the walls of the deposition chamber walls at about 250° C. to about 500° C.;

wherein the vapor phase metastable complexes adsorb onto the substrate surface and decompose, thus depositing a tungsten-based thin film on the substrate.

Embodiment 15: The method according to Embodiment 14, wherein the tungsten source precursor has a formal tungsten oxidation state of zero.

Embodiment 16: The method according to Embodiment 14 or 15, wherein the tungsten source precursor is selected from the group consisting of tungsten hexafluoride ($WF_6$), tungsten hexachloride ($WCl_6$), tungsten pentachloride ($WCl_5$); bis(tert-butylimido)bis(dimethylamido)tungsten [$(tBuN)_2(Me_2N_2W)$]; $W_2(NMe_2)_6$; tris(3-hexyne)tungsten carbonyl [$W(CO)(CH_3CH_2CCCH_2CH_3)_3$]; ethylcyclopentadienyltungsten(V)tricarbonylhydride ($HEtCpW(CO)_3$); tungsten ethoxide $W(OC\ (OC_2H_5))_6$; a tungsten pentacarbonyl dialkylamide $W(CO)_5{\cdot}NR_2$; and a tungsten pentacarbonyl trialkylamide $W(CO)_5{\cdot}NR_3$.

Embodiment 17: The method according to any of Embodiments 14 to 16, further comprising delivering hydrogen as a co-reactant to the synthesis and/or deposition chamber, optionally in combination with an inert gas.

Embodiment 18: The method according to any of Embodiments 14 to 16, further comprising delivering a nitrogen-containing gas as a co-reactant to the synthesis and/or deposition chamber, optionally in combination with an inert gas.

Embodiment 19: The method according to Embodiment 18, wherein the nitrogen containing gas is selected from the group consisting of ammonia and hydrogen azide.

Embodiment 20: The method according to any of Embodiments 14 to 19, wherein the method is selected from the group consisting of chemical vapor deposition, atomic layer deposition, molecular layer deposition, self-assembled monolayer deposition, and click chemistry deposition.

Embodiment 21: A method for depositing a tungsten-based thin film onto a substrate, the method comprising:

providing a substrate in a deposition chamber, wherein the deposition chamber has walls;

heating the substrate to about 100° C. to about 650° C.;

maintaining the substrate at about 100° C. to about 650° C.;

providing a vacuum manifold and a pumping system to the deposition chamber to maintain pressure in the deposition chamber;

providing a tungsten source precursor to the deposition chamber;

generating vapor phase molecular complexes from the tungsten source precursor; and generating a concentration or partial pressure of the vapor phase metastable complexes in the deposition chamber using a vacuum, inert gas, or a stabilizing gas to prevent self-reaction of the vapor phase metastable complexes by:

(a) forming a direct or remote soft plasma in the deposition chamber with a plasma power density of about 5 $W/cm^2$ to about 25 $W/cm^2$ while maintaining the walls of the deposition chamber walls at about 50° C. to about 250° C.; or (b) forming a direct or remote soft plasma in the deposition chamber with a plasma power density of about 0.01 $W/cm^2$ to about 5 $W/cm^2$ while maintaining the walls of the deposition chamber at about 250° C. to about 500° C.;

wherein the vapor phase metastable complexes adsorb onto the substrate surface and decompose, thus depositing a tungsten-based thin film on the substrate.

Embodiment 22: The method according to Embodiment 21, wherein the tungsten source precursor has a formal tungsten oxidation state of zero.

Embodiment 23: The method according to Embodiment 21 or 22, wherein the tungsten source precursor is selected from the group consisting of tungsten hexafluoride ($WF_6$), tungsten hexachloride ($WCl_6$), tungsten pentachloride ($WCl_5$); bis(tert-butylimido)bis(dimethylamido)tungsten [$(tBuN)_2(Me_2N)_2W$]; $W_2(NMe_2)_6$; tris(3-hexyne)tungsten carbonyl [$W(CO)(CH_3CH_2CCCH_2CH_3)_3$]; ethylcyclopentadienyltungsten(V)tricarbonylhydride ($HEtCpW(CO)_3$); tungsten ethoxide $W(OC\ (OC_2H_5))_6$; a tungsten pentacarbonyl dialkylamide $W(CO)_5{\cdot}NR_2$; and a tungsten pentacarbonyl trialkylamide $W(CO)_5{\cdot}NR_3$.

Embodiment 24: The method according to any of Embodiments 21 to 23, further comprising delivering hydrogen as a co-reactant to the synthesis and/or deposition chamber, optionally in combination with an inert gas.

Embodiment 25: The method according to any of Embodiments 21 to 23, further comprising delivering a nitrogen-containing gas as a co-reactant to the synthesis and/or deposition chamber, optionally in combination with an inert gas.

Embodiment 26: The method according to Embodiment 25, wherein the nitrogen containing gas is selected from the group consisting of ammonia and hydrogen azide.

BRIEF DESCRIPTION OF THE SEVERAL VIEWS OF THE DRAWINGS

The foregoing summary, as well as the following detailed description of the invention, will be better understood when read in conjunction with the appended drawings. To illustrate the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
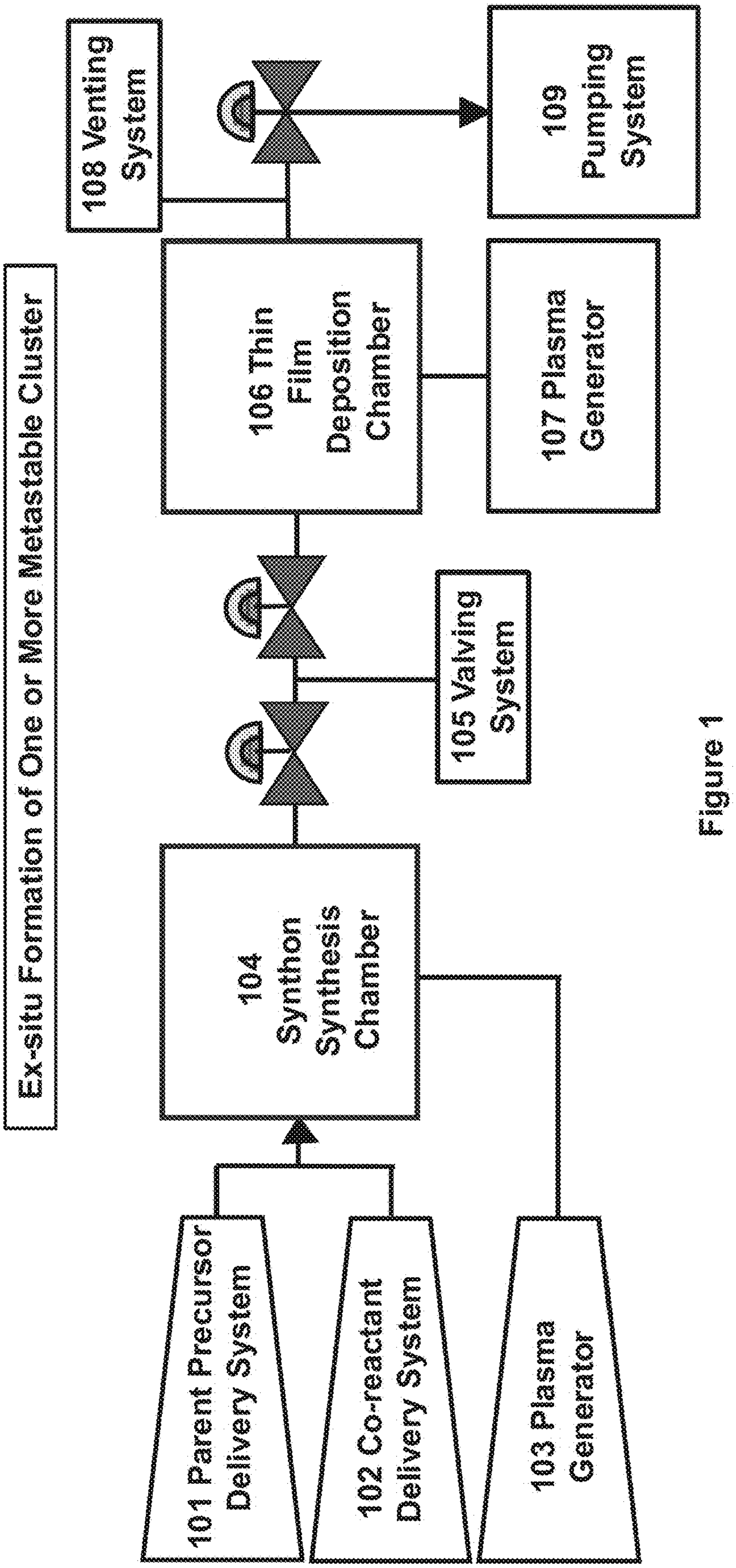
FIG. 1 is a schematic rendering of an apparatus for ex-situ thermal and/or plasma formation of one or more synthons that are then transported to a thin film deposition chamber where they react under CVD, pulsed CVD, ALD, MLD, SAM, or CCD conditions to form a W based thin film on a substrate according to embodiments of the disclosure.

Aspects of the disclosure relate to methods for tungsten (W) based thin film deposition, including chemical vapor deposition (CVD), atomic layer deposition (ALD), pulsed CVD, molecular layer deposition (MLD), self-assembled monolayer (SAM) deposition, and Click chemistry deposition (CCD) that allow the growth of W-based thin films onto a substrate with exact composition, morphology, structure, and thickness through regulated fabrication and decomposition of precursor metastable clusters or metastable complexes either in the vapor phase or on the substrate surface.

The disclosure provides four different methods for depositing a tungsten-based thin film onto a substrate, which will be described in detail below. The first method comprises:

providing a substrate in a deposition chamber, wherein the deposition chamber has walls;

heating the substrate to about 100° C. to about 650° C.;

maintaining the substrate at about 100° C. to about 650° C.;

providing a synthesis chamber which is distinct from the deposition chamber, wherein the synthesis chamber has walls;

connecting the synthesis chamber to the deposition chamber via a vacuum interlock or valving system;

heating the walls of the synthesis chamber to about 50° C. to about 500° C.;

providing a tungsten source precursor to the synthesis chamber;

generating vapor phase molecular complexes from the tungsten source precursor while maintaining the temperature of the walls of the synthesis chamber walls at about 50° C. to about 500° C.;

controlling a concentration or partial pressure of the vapor phase metastable complexes in the synthesis chamber using a vacuum, inert gas, or a stabilizing gas to prevent self-reaction of the vapor phase metastable complexes; and delivering the vapor phase metastable complexes to the deposition chamber, where the vapor phase metastable complexes decompose to form a tungsten-based thin film on the substrate by:

(a) maintaining the partial pressure of the vapor phase metastable complexes in the deposition chamber at about 1 to about 500 Torr while maintaining the walls of the deposition chamber at about 50° C. to about 350° C.; or (b) maintaining the partial pressure of the vapor phase metastable complexes in the deposition chamber at about 0.01 to about 10 Torr while maintaining the walls of the deposition chamber walls at about 350° C. to about 500° C.

The second method comprises:

providing a substrate in a deposition chamber, wherein the deposition chamber has walls;

heating the substrate to about 100° C. to about 650° C.;

maintaining the substrate at about 100° C. to about 650° C.;

providing a synthesis chamber which is distinct from the deposition chamber, wherein the synthesis chamber has walls;

connecting the synthesis chamber to the deposition chamber via a vacuum interlock or valving system;

maintaining the walls of the synthesis chamber at room temperature;

providing a tungsten source precursor to the synthesis chamber;

forming a direct or remote soft plasma in the synthesis chamber with a plasma power density of about 0.01 $W/cm^2$ to about 25 $W/cm^2$ to remove one or more source precursor ligands or molecular groups from the tungsten source precursor to form metastable complexes without completely decomposing the tungsten source precursor;

controlling a concentration or partial pressure of the vapor phase metastable complexes in the synthesis chamber using a vacuum, inert gas, or a stabilizing gas to prevent self-reaction of the vapor phase metastable complexes; and delivering the vapor phase metastable complexes to the deposition chamber, where the vapor phase metastable complexes decompose to form a tungsten-based thin film on the substrate by:

(a) forming a direct or remote soft plasma in the deposition chamber with a plasma power density of about 5 $W/cm^2$ to about 25 $W/cm^2$ while maintaining the walls of the deposition chamber walls at about 50° C. to about 250° C.; or (b) forming a direct or remote soft plasma in the deposition chamber with a plasma power density of about 0.01 $W/cm^2$ to about 5 $W/cm^2$ while maintaining the walls of the deposition chamber at about 250° C. to about 500° C.

The third method comprises:

providing a substrate in a deposition chamber, wherein the deposition chamber has walls;

heating the substrate to about 100° C. to about 650° C.;

maintaining the substrate at about 100° C. to about 650° C.;

providing a vacuum manifold and a pumping system to the deposition chamber to maintain pressure in the deposition chamber;

providing a tungsten source precursor to the deposition chamber;

generating vapor phase molecular complexes from the tungsten source precursor;

generating a concentration or partial pressure of the vapor phase metastable complex in the deposition chamber using a vacuum, inert gas, or a stabilizing gas to prevent self-reaction of the vapor phase metastable complexes by:

(a) maintaining the partial pressure of the vapor phase metastable complexes in the deposition chamber at about 10 to about 250 Torr while maintaining the walls of the deposition chamber at about 50° C. to about 250° C.; or (b) maintaining the partial pressure of the vapor phase metastable complexes in the deposition chamber at about 0.01 to about 10 Torr while maintaining the walls of the deposition chamber walls at about 250° C. to about 500° C.;

wherein the vapor phase metastable complexes adsorb onto the substrate surface and decompose, thus depositing a tungsten-based thin film on the substrate.

The fourth method for depositing a tungsten-based thin film onto a substrate comprises:

providing a substrate in a deposition chamber, wherein the deposition chamber has walls;

heating the substrate to about 100° C. to about 650° C.;

maintaining the substrate at about 100° C. to about 650° C.;

providing a vacuum manifold and a pumping system to the deposition chamber to maintain pressure in the deposition chamber;

providing a tungsten source precursor to the deposition chamber;

generating vapor phase molecular complexes from the tungsten source precursor;

generating a concentration or partial pressure of the vapor phase metastable complexes in the deposition chamber using a vacuum, inert gas, or a stabilizing gas to prevent self-reaction of the vapor phase metastable complexes by:

(a) forming a direct or remote soft plasma in the deposition chamber with a plasma power density of about 5 $W/cm^2$ to about 25 $W/cm^2$ while maintaining the walls of the deposition chamber walls at about 50° C. to about 250° C.; or (b) forming a direct or remote soft plasma in the deposition chamber with a plasma power density of about 0.01 $W/cm^2$ to about 5 $W/cm^2$ while maintaining the walls of the deposition chamber at about 250° C. to about 500° C.;

wherein the vapor phase metastable complexes adsorb onto the substrate surface and decompose, thus depositing a tungsten-based thin film on the substrate.

The ex-situ embodiments (first and second methods) may also be implemented by connecting the synthesis chamber directly to the deposition chamber without a vacuum interlock or valving system.

In this context and for the purposes of this disclosure, the term "precursor metastable cluster" may be understood to include a sub-precursor, a molecular group, a molecular species, a molecular structure, a molecular group, a synthon, a radical, or a coordinated molecular fragment that is produced or conceived from a parent precursor under controlled experimental conditions. For the purposes of this disclosure, the terms metastable cluster, metastable complex, complexing agent, and synthon are synonymous and used interchangeably, and may be understood to each refer to an entity that is more chemically active and/or significantly more energetic than the parent precursor and displays a reduced or shorter lifetime than the parent precursor in the vapor phase or on the substrate surface, with its lifetime being controllable or regulated. Such a entities may be formulated from the original precursor through the regulated removal or devised detachment or intended bond breakage of one or more of the parent precursor's atoms, atomic clusters, ligands, or molecular groups. The latter are more stable or inert, or less dynamically interactive than the metastable cluster and therefore do not contribute to the W-based film formation under the metastable cluster reaction and decomposition conditions. These metastable clusters are not transient since their lifetime or lifespan can be tightly managed and controlled so that they do not decompose in a transitory fashion or in an uncontrollable manner. In other words, these metastable clusters are not intermediates in the sense that they can exist in the vapor phase or on the substrate surface as distinctive, whole, or undecomposed entities until subjected to an energy source (e.g., thermal, plasma, chemical) of specific or pre-designed intensity or value to decompose them.

A complexing agent or metastable cluster or complex is an entity that is more chemically active or reactive and/or significantly more energetic than the parent precursor and displays a reduced or shorter lifetime than the parent precursor in the vapor phase or on the substrate surface. It can decompose under milder experimental conditions (such as lower substrate temperature, decreased electron energy, and reduced plasma power than the parent precursor) to yield a thin film with a desired composition and properties. It is a molecular species sufficiently long-lived as to be stable under the conditions and duration transport in the vapor phase to the substrate but is unstable under equilibrium conditions. A metastable complex can exist in a non-equilibrium gas phase regime imposed by the vapor phase environment, but is not stable on a substrate at standard temperature and pressure (STP) conditions and can also react with reactive gases adsorbed on the substrate surface under softer energetic environment that the parent molecule.

In one embodiment, the parent W precursor is preferably tungsten hexacarbonyl and the W metastable clusters generated from the tungsten hexacarbonyl precursor are $W(CO)_5$*, $W(CO)_4$*, $W(CO)_3$*, $W(CO)_2$*, and/or W(CO)*. These synthons can be generated from tungsten hexacarbonyl by a variety of methods, forming CO as a byproduct. In particular, $W(CO)_5$*, $W(CO)_4$*, $W(CO)_3$*, $W(CO)_2$*, and/or W(CO)* can be controllably generated from tungsten hexacarbonyl under pre-defined processing conditions, such as direct or remote plasma-assisted conditions, electron ionization at energy levels of 1 eV or greater (preferably between 2 eV and 25 eV), chemical ionization, thermal decomposition, and/or photolysis. Substrate temperatures are preferably in the range of in the range of about 100° C. to about 650° C., and more preferably in the range of about 200° C. to about 500° C. The reactor working pressure is preferably the range of about 1 torr to 250 torr, and more preferably in the range of about 5 torr to 20 torr.

Without wishing to be bound by theory, the mechanism for formation of the preferred metastable cluster $W(CO)_5$* appears to be the loss of CO from the coordination sphere of W in $W(CO)_6$, as shown below:

$$W(CO)_6 \text{ -----> } W(CO)_5^* + CO$$

The further loss of a CO group to form $W(CO)_5$* is another preferred W metastable cluster.

The above examples of synthons are exemplary and are not intended to be limiting. Those skilled in the art recognize that other synthons may also be formed and used in thin film deposition applications for W, WN, WC, WCN, and WO. It is also understood that "W-based films" refers to epitaxial, polycrystalline, or amorphous W, WN, WC, WCN, or WO.

According to aspects of the disclosure, high quality W and W-based thin films for a variety of advanced applications may be deposited or grown by CVD, ALD, MLD, SAM, and CCD deposition through the planned and regulated formation of gas phase metastable clusters or metastable complexes or synthons that are designed to enable the growth of W based thin films and layered structures with specific and desired composition, morphology, texture, and conformality.

Unless otherwise stated, any numerical value is to be understood as being modified in all instances by the term “about.” Thus, a numerical value typically includes ±10% of the recited value. For example, the recitation of a temperature such as “10° C.” or “about 10° C.” includes 9° C. and 11° C. and all temperatures there between.

All numerical ranges expressed in this disclosure expressly encompass all possible subranges, all individual numerical values within that range, including integers within such ranges and fractions and decimal amounts of the values unless the context clearly indicates otherwise. For example, a temperature of about 200° C. to about 600° C. encompasses temperatures of about 200° C., 210° C., 220° C., 230° C., 240° C., 250° C., 260° C., 270° C., 280° C., 290° C., 300° C., 310° C., 320° C., 330° C., 340° C., 350° C., 360° C., 370° C., 380° C., 390° C., 400° C., 410° C., 420° C., 430° C., 440° C., 450° C., 460° C., 470° C., 480° C., 490° C., 500° C., 510° C., 520° C., 530° C., 540° C., 550° C., 560° C., 570° C., 580° C., 590° C., 600° C., and all intervening temperatures.

The term “thin film” is well understood in the art and may include films ranging in thickness from a few nanometers to a few microns. More specifically, the term “thin film” may be understood to refer to a film having a thickness of less than about 5,000 nm and preferably between about 100 nm and about 500 nm and more preferably between about 25 nm and about 50 nm. For the purposes of this disclosure, the terms “layer” and “thin film” are synonymous.”

As used herein, “W-based films” refers to epitaxial, polycrystalline, or amorphous W, WN, WC, WCN, or WO.

In CVD, pulsed CVD, ALD, MLD, SAM, or CCD of typical unitary (single element), binary (dual element), or ternary (triple element) thin film growth, a few reactants comprising one or more precursors and one or more reactive or inert gases react to yield the target material. In this context, a “precursor” is defined as a compound or complex containing one or more of the elements desired in the final thin film product and which participates in a chemical reaction to produce the ultimate target material on a substrate surface.

According to the invention, however, complexing agents, metastable clusters, synthons, partial precursor molecular clusters or radicals, or coordinated molecular fragments are formed in the vapor phase from W-containing precursors and the metastable clusters, in turn, are directed to react with substrates at relatively low temperatures to deposit W-based films. The formation and deposition of these metastable clusters or metastable complexes on a substrate occur under conditions different and independent from the transport, deposition, or decomposition of the parent precursor and occur without the decomposition or reaction of the parent precursor. In particular, the adsorption and decomposition of the metastable clusters occurs at substrate temperatures below those required to decompose the parent precursor. This separate and independent production of metastable clusters allows the deposition of W-based films in lower thermal or energetic substrate environments, ensures greater conformality of the deposited W-based films, and allows film deposition on thermally or chemically fragile substrates. The synthons can be formed ex-situ in a synthesis chamber which is separate from but connected to the deposition chamber (FIG. 1), or in-situ in the deposition chamber (FIG. 2).

The metastable clusters do not exhibit a random or arbitrary lifetime in the sense that their existence can be accurately manipulated and controlled as to not disintegrate or decay in a transitory mode or in an uncontrollable manner. In other words, these metastable clusters are not simply intermediates in the sense that they can exist in the vapor phase or on the substrate surface as distinctive, whole, or undecomposed entities until subjected to an energy source (e.g., thermal, plasma, chemical) of specific or pre-designed intensity or value to decompose them.

In one embodiment, the ex-situ formation of the metastable clusters, metastable complexes, complexing agents, or synthons may be achieved thermally by heating the synthesis chamber walls to a temperature that ensures regulated removal or devised detachment or intended bond breakage of one or more of the parent precursor's ligands or molecular groups without completely decomposing the entire parent precursor, with the walls of the deposition chamber being heated to a temperature preferably below that of the synthesis chamber The ex-situ formation of these entities also be achieved through the application of a direct or remote soft plasma. In this context, a soft plasma is defined as a low power density plasma that is designed to enable regulated removal, devised detachment, or intended bond breakage of one or more of the parent precursor's ligands or molecular groups without completely decomposing the entire parent precursor. The ex-situ formation of the synthons may also be achieved through the application of a combination of thermal (e.g., heating the synthesis chamber walls) and direct or remote soft plasma.

Alternatively, the in-situ formation of the metastable clusters or complexing agents may be achieved thermally by, in one embodiment, heating the walls of the deposition chamber to a temperature that ensures regulated removal, devised detachment, or intended bond breakage of one or more of the parent precursor's ligands or molecular groups without completely decomposing the entire parent precursor. The in-situ formation of the synthons may also be achieved through the application of a direct or remote soft plasma as defined above. The in-situ formation of the metastable clusters may also be achieved through the application of a combination of thermal (e.g., heating the deposition chamber walls) and direct or remote soft plasma.

According to aspects of the disclosure, one or more metastable clusters, complexing agents, synthons, or partial precursor molecular clusters, radicals, or coordinated molecular fragments may be formed with different or varying structures, configurations, types, and/or chemistry in the vapor phase from a tungsten-containing precursor and these one or more synthons, in turn, are directed to react with substrates at relatively low temperatures to deposit tungsten-based films. It is understood that the delivery of the metastable complexes or synthons into the deposition chamber can be performed in a continuous fashion or in a pulsed fashion, with pulse ranging from about 0.1 seconds to about 120 seconds and more preferably from about 1 second to about 20 seconds.

In this context, a precursor metastable cluster is defined as a synthon, sub-precursor, or coordinated molecular cluster or radical or molecular fragment that is produced or conceived from the parent precursor in a controlled fashion. The metastable cluster is an entity that is more chemically active and/or significantly more energetic than the parent precursor and displays a reduced or shorter lifetime than the parent precursor in the vapor phase or on the substrate surface. Such a synthon may be formulated from the original precursor through the regulated removal, devised detachment, or intended bond breakage of one or more of the parent precursor's one or more constituent atoms, atomic clusters, ligands, or molecular groups that are more stable or inert, or less dynamically interactive than the synthon and therefore do not contribute to the tungsten-based film formation under the synthon reaction and decomposition conditions.

The metastable cluster synthon or molecular cluster self-reaction is prevented by controlling its concentration and/or its partial pressure in the vapor phase by pre-designed selection of process parameters including, for example, total pressure in the synthesis and/or deposition chamber, the temperature of the synthesis and/or deposition chamber walls, and/or the precursor source temperature, flow, and partial pressure in the synthesis and/or deposition chamber, as well as through the utilization of vacuum, an inert or reactive gas or a gas that behaves as a stabilizer. In the case of the ex-situ formation of the metastable complexes, the walls of the deposition chamber are heated to a temperature preferably below that of the synthesis chamber The invention enables the well-regulated synthesis of the metastable clusters with no or negligible production of other species that can interfere with the deposition or co-deposit with the synthons. Implicitly, this requires that the experimental parameters needed to generate the synthons are relatively soft, with upper limits of the temperatures of the walls of the synthesis chamber and deposition chamber not exceeding about 500° C. and about 350° C., respectively, a substrate temperature practically not exceeding about 600° C., and electron ionization impact energies not exceeding about 18 eV.

According to aspects of the disclosure, it is feasible to purposely, calculatedly, methodically, and deliberately create these synthons from the original precursor structure, to organize and direct their reaction, and to eliminate undesirable gas-phase reactions or gas-phase depletion phenomena, while enabling their optimized and managed decomposition to allow the growth of W-based thin films and layered structures with specific and desired composition, morphology, texture, and structure.

Also, according to the disclosure, the synthons are synthesized such that the substrate surface does not contribute to nor catalyze their creation. Instead, the synthons are designed to be more reactive with the substrate than their parent precursor. This contrasts with the traditional thermally driven deposition of thin films, where precursor conversion to a deposited film is enabled by raising the substrate temperature to afford a thermally catalyzed chemical interaction. Similarly, plasma activation of substrates either directly, remotely, or near the substrate, contrasts with the methods described herein, because fragile substrates are altered or damaged by the highly energetic plasma environment.

First Method (Ex-Situ)

The first method comprises:

- providing a substrate in a deposition chamber, wherein the deposition chamber has walls;
- heating the substrate to about 100° C. to about 650° C.;
- maintaining the substrate at about 100° C. to about 650° C.;
- providing a synthesis chamber which is distinct from the deposition chamber, wherein the synthesis chamber has walls;
- connecting the synthesis chamber to the deposition chamber via a vacuum interlock or valving system;
- heating the walls of the synthesis chamber to about 50° C. to about 500° C.;
- providing a tungsten source precursor to the synthesis chamber;
- generating vapor phase molecular complexes from the tungsten source precursor while maintaining the temperature of the walls of the synthesis chamber walls at about 50° C. to about 500° C.;
- controlling a concentration or partial pressure of the vapor phase metastable complexes in the synthesis chamber using a vacuum, inert gas, or a stabilizing gas to prevent self-reaction of the vapor phase metastable complexes; and
- delivering the vapor phase metastable complexes to the deposition chamber, where the vapor phase metastable complexes decompose to form a tungsten-based thin film on the substrate by:
- (a) maintaining the partial pressure of the vapor phase metastable complexes in the deposition chamber at about 1 to about 500 Torr while maintaining the walls of the deposition chamber at about 50° C. to about 350° C.; or
- (b) maintaining the partial pressure of the vapor phase metastable complexes in the deposition chamber at about 0.01 to about 10 Torr while maintaining the walls of the deposition chamber walls at about 350° C. to about 500° C.

The first step of the method involves providing a substrate in a deposition chamber, wherein the deposition chamber has walls. Appropriate deposition chambers or reactors used for CVD, ALD, etc. are well understood in the art and not limited in any way.

Examples of the substrates that may be utilized for formation of W-based films include, for example, metals such as copper, nickel, tungsten, cobalt, silver, platinum, gold, ruthenium, titanium, and tantalum; metal compounds and alloys such as oxides, nitrides and carbides, silicon, silicon dioxide, and the like which are found in IC, high temperature devices, photoluminescent devices, and solar cell technologies.

There is essentially no limitation on the type of substrate that can be used in the methods described herein. Preferably, however, the substrate is thermally and chemically stable at the conditions used for depositing the film or films onto the substrate. That is, the substrate is preferably stable at temperatures between about 150° C. and about 650° C. It will be understood by those skilled in the art that the thermal stability of the substrate may depend on various factors, such as the type of film to be deposited and the intended use of the coated substrate.

The substrate is then heated to about 100° C. to about 650° C. and maintained at this temperature. As explained above, all temperatures within this range may be contemplated by this step.

Next, a synthesis chamber which is distinct from the deposition chamber is provided, wherein the synthesis chamber has walls. The synthesis chamber is connected to the deposition chamber via a vacuum interlock or valving system. The walls of the synthesis chamber are then heated to about 50° C. to about 500° C., or to any temperature within this range, such as about 50° C., 60° C., 70° C., 80° C., 90° C., 100° C., 110° C., 120° C., 130° C., 140° C., 150° C., 160° C., 170° C., 180° C., 190° C., 200° C., 210° C., 220° C., 230° C., 240° C., 250° C., 260° C., 270° C., 280° C., 290° C., 300° C., 310° C., 320° C., 330° C., 340° C., 350° C., 360° C., 370° C., 380° C., 390° C., 400° C., 410° C., 420° C., 430° C., 440° C., 450° C., 460° C., 470° C., 480° C., 490° C., 500° C., and all intervening temperatures.

Subsequently, the method involves providing a tungsten source precursor to the synthesis chamber. The tungsten source may be delivered in gaseous or vapor form in a continuous or pulsed manner with or without carrier gas. In some embodiments, the parent tungsten precursors are preferably $W^{(0)}$ precursors, that is, those having a formal tungsten oxidation state of zero. In one such preferred embodiment, the parent $W^{(0)}$ precursor for generating a W synthon to form tungsten-based films is tungsten hexacarbonyl.

Further appropriate tungsten source precursors include, for example and without limitation, inorganic compounds, such as halide classes of precursors including tungsten hexafluoride ($WF_6$), tungsten hexachloride ($WCl_6$), and tungsten pentachloride ($WCl_5$); and metal-organic and organo-metallic classes of tungsten precursors such as bis (tert-butylimido)bis(dimethylamido)tungsten $[(tBuN)_2(Me_2N)_2W]$; $W_2(NMe_2)_6$; tris(3-hexyne)tungsten carbonyl $[W(CO)(CH_3CH_2CCCH_2CH_3)_3]$; ethylcyclopentadienyl-tungsten(V)tricarbonylhydride ($HEtCpW(CO)_3$); tungsten ethoxide $W(OC(OC_2H_5))_6$; tungsten pentacarbonyl dialkylamides $W(CO)_5 \cdot NR_2$; and tungsten pentacarbonyl trialkylamides $W(CO)_5 \cdot NR_3$. Other appropriate precursors include $HW(CO)_5$*, $HW(CO)_4$*, $HW(CO)_3$*, $HW(CO)_2$*, and HW(CO)* as explained below.

The next step involves generating vapor phase molecular complexes from the tungsten source precursor, thermally and/or through a direct or remote plasma while maintaining the temperature of the walls of the synthesis chamber walls at about 50° C. to about 500° C., including all intermediate temperatures and ranges. The concentration or partial pressure of the vapor phase metastable complexes in the synthesis chamber is controlled using a vacuum, inert gas, or a stabilizing gas to prevent self-reaction of the vapor phase metastable complexes; and method finally involves delivering the vapor phase metastable complexes to the deposition chamber in gaseous or vapor form in a continuous or pulsed manner with or without carrier gas, where the vapor phase metastable complexes decompose to form a tungsten-based thin film on the substrate by:

(a) maintaining the partial pressure of the vapor phase metastable complexes in the deposition chamber at about 1 to about 500 Torr while maintaining the walls of the deposition chamber at about 50° C. to about 350° C.; or (b) maintaining the partial pressure of the vapor phase metastable complexes in the deposition chamber at about 0.01 to about 10 Torr while maintaining the walls of the deposition chamber walls at about 350° C. to about 500° C.

It is noted that all of the pressures and temperature ranges in these steps include all intervening pressures and temperatures, as explained above, In some embodiments, the method further comprises delivering hydrogen as a co-reactant to the synthesis and/or deposition chamber, optionally in combination with an inert gas. In some embodiments, the tungsten source precursor is $HW(CO)_5$*, $HW(CO)_4$*, $HW(CO)_3$*, $HW(CO)_2$*, or HW(CO)*.

In some embodiments, the method further comprises delivering a nitrogen-containing gas as a co-reactant to the synthesis and/or deposition chamber, optionally in combination with an inert gas. In some embodiments, the nitrogen containing gas is selected from the group consisting of ammonia and hydrogen azide.

In some embodiments, the method is selected from the group consisting of chemical vapor deposition, atomic layer deposition, molecular layer deposition, self-assembled monolayer deposition, and click chemistry deposition.

Second Method (Ex-Situ)

The second method comprises:

providing a substrate in a deposition chamber, wherein the deposition chamber has walls;

heating the substrate to about 100° C. to about 650° C.;

maintaining the substrate at about 100° C. to about 650° C.;

providing a synthesis chamber which is distinct from the deposition chamber, wherein the synthesis chamber has walls;

connecting the synthesis chamber to the deposition chamber via a vacuum interlock or valving system;

maintaining the walls of the synthesis chamber at room temperature;

providing a tungsten source precursor to the synthesis chamber;

forming a direct or remote soft plasma in the synthesis chamber with a plasma power density of about 0.01 $W/cm^2$ to about 25 $W/cm^2$ to remove one or more source precursor ligands or molecular groups from the tungsten source precursor to form metastable complexes without completely decomposing the tungsten source precursor;

controlling a concentration or partial pressure of the vapor phase metastable complexes in the synthesis chamber using a vacuum, inert gas, or a stabilizing gas to prevent self-reaction of the vapor phase metastable complexes; and delivering the vapor phase metastable complexes to the deposition chamber, where the vapor phase metastable complexes decompose to form a tungsten-based thin film on the substrate by:

(a) forming a direct or remote soft plasma in the deposition chamber with a plasma power density of about 5 $W/cm^2$ to about 25 $W/cm^2$ while maintaining the walls of the deposition chamber walls at about 50° C. to about 250° C.; or (b) forming a direct or remote soft plasma in the deposition chamber with a plasma power density of about 0.01 $W/cm^2$ to about 5 $W/cm^2$ while maintaining the walls of the deposition chamber at about 250° C. to about 500° C.

Several of these steps have been described above with respect to the first method and those descriptions apply herein as well.

After the tungsten source precursor has been provided to the synthesis chamber, the method involves forming a direct or remote soft plasma in the synthesis chamber with a plasma power density of about 0.01 $W/cm^2$ to about 25 $W/cm^2$ to remove one or more source precursor ligands or molecular groups from the tungsten source precursor to form metastable complexes without completely decomposing the tungsten source precursor.

In this method, the tungsten-based thin film is formed as the vapor phase metastable complexes decompose by:

(a) forming a direct or remote soft plasma in the deposition chamber with a plasma power density of about 5 $W/cm^2$ to about 25 $W/cm^2$ while maintaining the walls of the deposition chamber walls at about 50° C. to about 250° C.; or (b) forming a direct or remote soft plasma in the deposition chamber with a plasma power density of about 0.01 $W/cm^2$ to about 5 $W/cm^2$ while maintaining the walls of the deposition chamber at about 250° C. to about 500° C.

The second method may further involve delivering hydrogen or a nitrogen-containing gas as a co-reactant, as explained above.

Third Method (In-Situ)

The third method involves:

providing a substrate in a deposition chamber, wherein the deposition chamber has walls;

heating the substrate to about 100° C. to about 650° C.;

maintaining the substrate at about 100° C. to about 650° C.;

providing a vacuum manifold and a pumping system to the deposition chamber to maintain pressure in the deposition chamber;

providing a tungsten source precursor to the deposition chamber;

generating vapor phase molecular complexes from the tungsten source precursor;

generating a concentration or partial pressure of the vapor phase metastable complex in the deposition chamber using a vacuum, inert gas, or a stabilizing gas to prevent self-reaction of the vapor phase metastable complexes by:

(a) maintaining the partial pressure of the vapor phase metastable complexes in the deposition chamber at about 10 to about 250 Torr while maintaining the walls of the deposition chamber at about 50° C. to about 250° C.; or (b) maintaining the partial pressure of the vapor phase metastable complexes in the deposition chamber at about 0.01 to about 10 Torr while maintaining the walls of the deposition chamber walls at about 250° C. to about 500° C.;

wherein the vapor phase metastable complexes adsorb onto the substrate surface and decompose, thus depositing a tungsten-based thin film on the substrate.

All of these steps have been described previously with respect to the first, and/or second methods.

The third step of this method involves providing a vacuum manifold and a pumping system to the deposition chamber to maintain pressure in the deposition chamber. Such components are not limited in any way and are well understood in the art.

The final step of the method involves the adsorption of the molecular complexes onto the substrate surface and the decomposition thereof, thus depositing a tungsten-based thin film on the substrate from the vapor phase metastable complexes.

The third method may further involve delivering hydrogen or a nitrogen-containing gas as a co-reactant, as explained above.

Fourth Method (In-Situ)

The fourth method comprises:

providing a substrate in a deposition chamber, wherein the deposition chamber has walls;

heating the substrate to about 100° C. to about 650° C.;

maintaining the substrate at about 100° C. to about 650° C.;

providing a vacuum manifold and a pumping system to the deposition chamber to maintain pressure in the deposition chamber;

providing a tungsten source precursor to the deposition chamber;

generating vapor phase molecular complexes from the tungsten source precursor;

generating a concentration or partial pressure of the vapor phase metastable complexes in the deposition chamber using a vacuum, inert gas, or a stabilizing gas to prevent self-reaction of the vapor phase metastable complexes by:

(a) forming a direct or remote soft plasma in the deposition chamber with a plasma power density of about 5 $W/cm^2$ to about 25 $W/cm^2$ while maintaining the walls of the deposition chamber walls at about 50° C. to about 250° C.; or (b) forming a direct or remote soft plasma in the deposition chamber with a plasma power density of about 0.01 $W/cm^2$ to about 5 $W/cm^2$ while maintaining the walls of the deposition chamber at about 250° C. to about 500° C.;

wherein the vapor phase metastable complexes adsorb onto the substrate surface and decompose, thus depositing a tungsten-based thin film on the substrate.

All of these steps have been described previously with respect to the first, second, and/or third methods.

The fourth method may further involve delivering hydrogen or a nitrogen-containing gas as a co-reactant, as explained above.

General Considerations

As described in detail above, in some embodiments, the metastable clusters can be formed in a separate synthesis chamber or vessel from a starting precursor, and then these molecular clusters are introduced in the CVD, pulsed CVD, ALD, MLD, SAM, or CCD thin film processing chamber for consumption and film formation. It is understood that the introduction of these metastable complexes or synthons into the deposition chamber may be performed in a continuous fashion or in a pulsed fashion, with pulse times ranging from about 0.1 seconds to about 120 seconds and more preferably from about 1 second to 20 seconds.

In other embodiments, the synthons are synthesized directly in the CVD, pulsed CVD, ALD, MLD, SAM, or CCD thin film deposition chamber.

The methods described herein do not include homolytic "cracking" of dimers which form equivalent radicals, molecular ions, or radicals formed under thermal, plasma or ionizing conditions in which there are no stable byproducts. In essence, the hemolytic cracking of dimers is in equilibrium with the starting dimers and polymers, whereas precursors utilized in the invention lead to synthons in which the thermodynamics of decomposition and reaction are inherently more energetically favorable than recombination to form the initial precursor. By way of exemplary explanation, the methods described herein are entirely distinct from the concept of ex-situ pyrolysis of dimeric precursor such as di-para-xylylene in a first reaction chamber (external furnace) at very high temperatures (>680° C.) to produce a monomer such as para-xylylene, which is then released into a second (deposition) chamber to deposit a polymeric film at room temperature, but can reform the dimeric precursor in or on deposited film. The pyrolysis reaction to form the monomer cannot be carried out in-situ in the deposition chamber, because it would interfere with chemical reaction associated with the deposition of the desired coating.

In some embodiments according to aspects of the disclosure, pure tungsten films are grown from the metastable cluster $W(CO)_5$*, where the notation "*" indicates an unsatisfied coordination sphere. The films can be deposited at relatively low temperatures, namely at temperatures between about 150° C. to about 550° C. For example, $W(CO)_5$* can be generated separately or within the deposition chamber from the parent precursor tungsten hexacarbonyl $W(CO)_6$ by thermal, plasma-assisted, or plasma enhanced conditions. In the presence of hydrogen, the metastable clusters can be $HW(CO)_5$*. Similarly, $HW(CO)_4$* may be a preferred synthon. The process has advantages associated with both relatively low thermal or low energy environments and eliminates particle formation in the gas phase.

In yet another example, the metastable cluster $W(CO)_5$* is generated by photolysis of tungsten hexacarbonyl at a wavelength of about 220 to about 250 nm in a carbon monoxide carrier gas. These molecular clusters can also be generated in a similar fashion from other tungsten source precursors, such as In another embodiment of the disclosure, tungsten nitride films are formed by generating a metastable cluster and then introducing the metastable cluster into a deposition chamber in combination with another reactive gas with which it can then react to form a WN film. For example, ammonia or hydrogen azide are selected as a reactive gas since it can be purposely and reliably regulated at temperatures above about 250° C. to form $NH_2$* and/or NH* radicals which can then be introduced into a deposition chamber in combination with $W(CO)_6$ to deposit WN at substrate temperatures between 150° to 500° C. While the deposition of tungsten nitride at temperatures above about 350° C. through the direct reaction of ammonia or hydrogen azide with W(CO) 6 can occur in one step rather than two steps, the substrate would have to withstand temperatures above about 350° C. without being thermally damaged for the reaction to be acceptable as a single step. The independent formation of the synthons reduces the potential of thermally induced damage to the substrate.

Alternatively, the $NH_2$* and/or NH* radicals may be generated in one synthesis chamber while, concurrently, the metastable cluster $W(CO)_5$* may be generated in a separate second synthesis chamber, then both metastable clusters are introduced into a deposition chamber where they react to form a WN film.

Similarly, diazomethane may be anticipated to intentionally and controllably directed to form a carbene by elimination of nitrogen and utilized to form tungsten carbide films.

In another embodiment of the invention, tungsten carbide films are formed by generating a synthon and then introducing the synthon into a deposition chamber where it reacts to form a WC thin film on a substrate. For example, synthons for WC may include dienes and acetylenes.

As described in detail above, aspects of the disclosure relate to high-quality W based thin films formed by thermal or plasma CVD, ALD, MLD, SAM, or CCD deposition on various substrates, and a method for depositing such films. The methods of the present disclosure may deposit such W based films as a thin amorphous or polycrystalline film or an epitaxial film on a substrate.

In one embodiment, the present disclosure relates to W-based films formed from one or more precursor metastable clusters. A metastable cluster is defined as a sub-precursor or molecular cluster or radical or coordinated molecular fragment that is produced or conceived from the parent precursor. It is generated from parent W precursors, and further relates to associated methods for the thermal or plasma CVD, ALD, MLD, SAM, or CCD of such W based films on various substrates. As used herein, "W-based films" refers to epitaxial, polycrystalline, or amorphous W, WN, WC, WCN, or WO.

Under planned thermal or plasma CVD, ALD, MLD, SAM, or CCD deposition conditions, including specific temperature, pressure, and key processing conditions (such as providing additional tailored chemical, thermal, plasma, or ionization energy) to tailor the conversion of the parent $W^{(0)}$ precursors in order that they are controllably converted in-situ to specific and desirable metastable clusters, such as $W(CO)_5$*, $W(CO)_4$*, $W(CO)_3$*, $W(CO)_2$*, and W(CO)* in the case of tungsten hexacarbonyl, that are designed to grow epitaxial or amorphous films with specific composition, conformality, morphology and structure.

The in-situ formation of the metastable clusters may be achieved thermally by, in one embodiment, heating the walls of the deposition chamber to a temperature that ensures regulated removal, devised detachment, or intended bond breakage of one or more of the parent precursor's ligands or molecular groups without completely decomposing the entire parent precursor. In this embodiment, the walls of the deposition chamber are heated to a conversion temperature between about 50° C. and about 500° C. to generate synthons from the parent tungsten source precursor. To prevent any undesirable gas phase reactions, the partial pressure of the vapor phase synthons in the deposition chamber is maintained at about 1 to about 500 Torr while the deposition chamber walls are maintained at a temperature of about 50° C. to about 250° C. Alternatively, the partial pressure of the vapor phase metastable clusters in the deposition chamber is maintained at about 0.01 to about 10 Torr while the deposition chamber walls are maintained at a temperature of about 250° C. to about 400° C. A vacuum, inert gas, or a stabilizing gas may also be used to prevent self-reaction of the synthons.

The in-situ formation of the metastable clusters may also be achieved through the application of a direct or remote soft plasma as defined above. In this case, the plasma power density in the deposition chamber is maintained at about 0.01 $W/cm^2$ to about 25 $W/cm^2$ without heating the deposition chamber walls. The in-situ formation of the metastable clusters may also be achieved through the application of a combination of thermal (e.g., heating the deposition chamber walls) and direct or remote soft plasma. To prevent any undesirable gas phase reactions, the plasma power density in the deposition chamber is maintained at about 5 $W/cm^2$ to about 25 $W/cm^2$ while the deposition chamber walls are maintained at a temperature of about 50° C. to about 250° C. Alternatively, the plasma power density in the deposition chamber is maintained at about 0.01 $W/cm^2$ to about 5 $W/cm^2$ while the deposition chamber walls are maintained at a temperature of about 250° C. to about 500° C. A vacuum, inert gas, or a stabilizing gas may also be used to prevent self-reaction of the synthons.

The ex-situ formation of the metastable clusters may be achieved thermally by, in one embodiment, heating the synthesis chamber walls to a temperature that ensures regulated removal, devised detachment or intended bond breakage of one or more of the parent precursor's ligands or molecular groups without completely decomposing the entire parent precursor. In this case, heating the synthesis chamber walls to a conversion temperature between about 50° C. and about 500° C. and maintaining the concentration or partial pressure of the vapor phase metastable complexes in the synthesis chamber from about 5% to about 95% of the total reactant concentration or total pressure in the synthesis chamber using a vacuum, inert gas, or a stabilizing gas helps prevent self-reaction of the metastable complexes. To prevent any undesirable gas phase reactions, the partial pressure of the vapor phase synthons in the deposition chamber is maintained at about 10 to about 500 Torr while the deposition chamber walls are maintained at a temperature of about 50° C. to about 250° C. Alternatively, the partial pressure of the vapor phase metastable clusters in the synthesis chamber is maintained at about 0.01 to about 10 Torr while the deposition chamber walls are maintained at a temperature of about 250° C. to about 500° C. A vacuum, inert gas, or a stabilizing gas may also be used to prevent self-reaction of the synthons.

The ex-situ formation of the synthons may also be achieved through the application of a direct or remote soft plasma as defined above. In this case, the plasma power density in the synthesis chamber is maintained at about 0.01 $W/cm^2$ to about 25 $W/cm^2$ without heating the synthesis chamber walls. To prevent any undesirable gas phase reactions, the plasma power density in the deposition chamber is maintained at about 5 $W/cm^2$ to about 25 $W/cm^2$ while the deposition chamber walls are maintained at a temperature of about 50° C. to about 250° C. Alternatively, the plasma power density in the deposition chamber is maintained at about 0.01 $W/cm^2$ to about 5 $W/cm^2$ while the deposition chamber walls are maintained at a temperature of about 250° C. to about 500° C. A vacuum, inert gas, or a stabilizing gas may also be used to prevent self-reaction of the synthons.

For tungsten-based thin film deposition, substrate temperatures are preferably in the range of about 100° C. to about 650° C., and more preferably in the range of about 200° C. to about 500° C. For tungsten-based thin film formation, the total synthesis or deposition chamber working pressure is preferably in the range of about 0.01 torr to 250 torr, and more preferably in the range of about 5 torr to 20 torr.

Referring to FIG. 2, in one embodiment, the parent W precursor, and even more particularly the parent $W^{(0)}$ precursor, is introduced though a parent precursor delivery system 201 into a CVD, ALD, MLD, SAM, or CCD thin film deposition chamber 204 for production of the metastable clusters directly in the deposition chamber, either in the vapor phase or on the substrate surface. The parent precursor may be introduced into the deposition chamber 204 with or without an inert carrier gas, such as, for example, argon, helium, xenon, krypton, or nitrogen, which, if employed, is introduced through co-reactant delivery system 202. The inert carrier gas which is utilized may depend upon the type of film to be formed. Preferably, the inert carrier gas is neon, helium or argon.

In such an in-situ embodiment of the method, the deposition chamber is initially set to predetermined parameters particularly suited for metastable cluster generation, in order to enable the conversion of the parent precursors to the synthons within the deposition chamber.

For example, when $WCO)_6$ is utilized as the precursor and thermal decomposition is utilized to convert $(WCO)_6$ to the $W(CO)_5$* metastable clusters, the deposition chamber is preferably initially operated at a conversion temperature between about 100° C. and about 350° C.

Concurrently, the substrate is preferably set to predetermined processing parameters (including during substrate introduction into the deposition chamber) to enable thermal decomposition of the metastable clusters and formation of the W-based film from metastable clusters (i.e., consumption of the synthons). In the thermal deposition processes, the substrate is preferably maintained at a deposition temperature between about 100° C. and about 650° C., and more preferably between about 250° C. and about 500° C.

The in-situ formation of the metastable clusters can be achieved thermally by, in one embodiment, heating the walls of the deposition chamber 204 to a temperature that ensures regulated removal or devised detachment or intended bond breakage of one or more of the parent precursor's ligands or molecular groups without completely decomposing the entire parent precursor. In this case, heating the deposition chamber walls to a conversion temperature between about 50° C. and about 500° C. generates synthons from the parent W source precursor. To prevent any undesirable gas phase reactions, the partial pressure of the vapor phase synthons in the deposition chamber is maintained at about 10 to about 250 Torr while the deposition chamber walls are maintained at a temperature of about 50° C. to about 250° C. Alternatively, the partial pressure of the vapor phase synthons in the deposition chamber is maintained at about 0.01 to about 10 Torr while the deposition chamber walls are maintained at a temperature of about 250° C. to about 500° C.

As further shown in FIG. 2, the parent precursor is first introduced using a precursor delivery system 201, either individually or in combination with a co-reactant and/or carrier gas using the delivery system 202 into the deposition chamber 204, where the metastable clusters are generated controllably and reliably from the parent precursor, and subsequently consumed in the thin film deposition process. The synthons may be in the deposition environment with other carrier and/or reactant gases, as described above. The in-situ metastable complex generation set-up may also include a valving system 203 that separates the delivery systems and thin film deposition chamber and which may also serve as a venting system. It may also be equipped with a direct or remote plasma generator 205 that assists in the metastable complex decomposition in the deposition chamber 204. A venting system 206 and a pumping system 207 are used to control the reactant flows and pressure in the deposition chamber 204.

A vacuum introduced through pumping system 208, an inert gas introduced through co-reactant delivery system 202, or a stabilizing gas introduced through co-reactant delivery system 202 may also be used to prevent self-reaction of the synthons.

As further shown in FIG. 2, the in-situ formation of the metastable clusters may also be achieved through the application of a direct or remote soft plasma as defined above from plasma generator 205. In this case, the plasma power density in the deposition chamber is maintained at about 0.01 $W/cm^2$ to about 25 $W/cm^2$ without heating the deposition chamber walls. The in-situ formation of the synthons can also be achieved through the application of a combination of thermal (e.g., heating the deposition chamber walls) and direct or remote soft plasma. To prevent any undesirable gas phase reactions, the plasma power density in the deposition chamber 204 is maintained at about 5 $W/cm^2$ to about 25 $W/cm^2$ while the deposition chamber walls are maintained at a temperature of about 50° C. to about 200° C. Alternatively, the plasma power density in the deposition chamber 204 is maintained at about 0.01 $W/cm^2$ to about 5 $W/cm^2$ while the deposition chamber walls are maintained at a temperature of about 200° C. to about 500° C. A vacuum, inert gas, or a stabilizing gas may also be used to prevent self-reaction of the synthons as explained above.

After generation of the synthons, the deposition chamber may then optionally be purged by venting system 207 to remove all byproducts.

In one embodiment, hydrogen is used as co-reactant using delivery system 202, either individually, or in combination with an inert gas such as argon.

Figure 2:
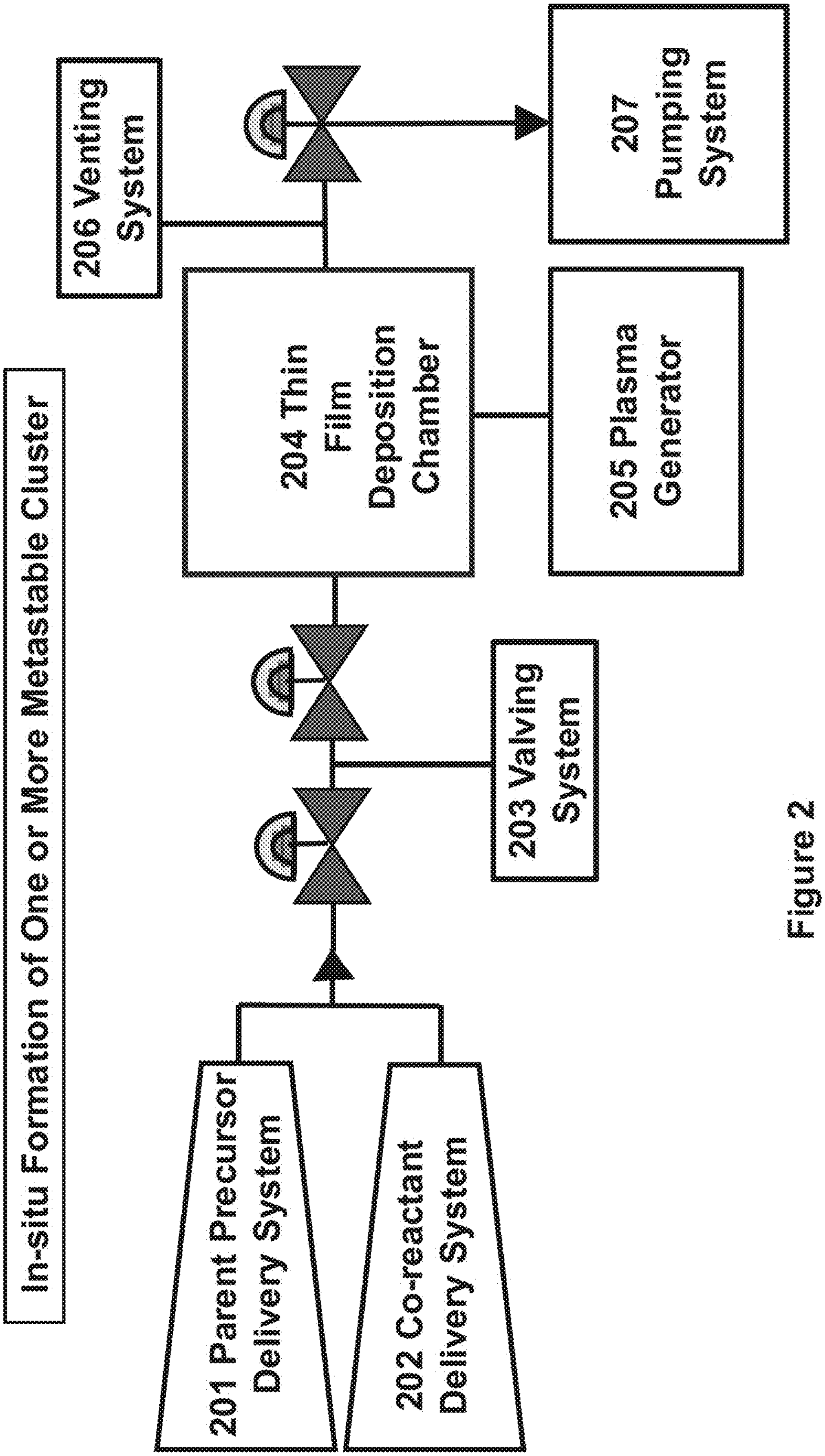
FIG. 2 is a schematic rendering of an apparatus for in-situ thermal and/or plasma formation of one or more synthons in a thin film deposition chamber where they then react under CVD, pulsed CVD, ALD, MLD, SAM, or CCD conditions to form a W based thin film on a substrate according to embodiments of the disclosure.

Referring to FIG. 1, in another embodiment, the parent precursor is first introduced using a parent precursor delivery system 101, either individually or in combination with a co-reactant and/or carrier gas using co-reactant delivery system 102 into a separate synthesis chamber 104 or vessel (i.e., separate from the thin film deposition chamber 106), where the metastable clusters are generated controllably and reliably from the parent precursor, and then synthons are generated and transported in the gas phase (with or without an inert carrier gas, and/or with or without a co-reactant such as hydrogen using the delivery system 102] to the CVD, pulsed CVD, ALD, SAM, or CCD deposition chamber 106, where they are consumed in the thin film deposition process. The synthons may be in the deposition environment with precursor molecules and other carrier and/or reactant gases, as described above.

The ex-situ metastable complex generation set-up may also include a valving system 105 that separates the precursor synthesis and thin film deposition chambers and which may also serve as a venting system. It may also be equipped with a direct or remote plasma generator 103 that assists in the metastable complex generation in the synthesis chamber 104 and a direct or remote plasma generator 107 that assists in the metastable complex decomposition in the deposition chamber 106. A venting system 108 and a pumping system 109 are used to control the reactant flows and pressure in the deposition chamber 106.

As explained above, the ex-situ formation of the metastable clusters may be achieved thermally by, in one embodiment, heating the synthesis chamber walls to a temperature that ensures regulated removal or devised detachment or intended bond breakage of one or more of the parent precursor's ligands or molecular groups without completely decomposing the entire parent precursor. In this case, heating the synthesis chamber walls to a conversion temperature between about 50° C. and about 500° C. generates synthons from the parent W source precursor. To prevent any undesirable gas phase reactions, the partial pressure of the vapor phase synthons in the deposition chamber is maintained at about 1 to about 500 Torr while the deposition chamber walls are maintained at a temperature of about 50° C. to about 350° C. Alternatively, the partial pressure of the vapor phase synthons in the deposition chamber is maintained at about 0.01 to about 10 Torr while the deposition chamber walls are maintained at a temperature of about 350° C. to about 600° C. A vacuum, inert gas, or a stabilizing gas may also be used to prevent self-reaction of the synthons.

The ex-situ formation of the synthons may also be achieved through the application of a direct or remote soft plasma as defined above. In this case, the plasma power density in the synthesis chamber is maintained at about 0.01 $W/cm^2$ to about 25 $W/cm^2$ without heating the synthesis chamber walls. To prevent any undesirable gas phase reactions, the plasma power density in the deposition chamber is maintained at about 5 $W/cm^2$ to about 25 $W/cm^2$ while the deposition chamber walls are maintained at a temperature of about 50° C. to about 250° C. Alternatively, the plasma power density in the deposition chamber is maintained at about 0.01 $W/cm^2$ to about 5 $W/cm^2$ while the deposition chamber walls are maintained at a temperature of about 250° C. to about 500° C. A vacuum, inert gas, or a stabilizing gas may also be used to prevent self-reaction of the synthons.

Preferably, the metastable clusters synthesis chamber is connected under controlled conditions, such as by a vacuum interlock or valving system, to the deposition chamber. More particularly, the effluent or product of the synthons synthesis chamber is directly transported via a conduit or manifold system from the synthons synthesis chamber to the film deposition chamber. As such, the synthons synthesis chamber and the deposition chamber are connected directly with each other physically without exposure of the synthons to air or the surrounding environment.

In some embodiments, the controlled environment under which the synthons synthesis chamber is connected to the deposition chamber is one of vacuum, inert gas, hydrogen, reactive gas, or a combination of such gases.

Similarly, in the synthons synthesis chamber, the tungsten synthons may be generated from the parent tungsten precursor in various manners, such as direct or remote plasma-assisted conditions, electron ionization at energy levels of about 1 eV or greater (preferably between about 1 eV and about 20 eV), chemical ionization, photolysis and/or thermal decomposition.

In one embodiment, the synthesis chamber contains a mechanism for separating reaction byproducts, such as a selective adsorption bed (e.g., activated carbon), a molecular sieve, a metal-organic framework that removes the byproducts from the vapor transport stream, a specific chamber design, or specialized chamber flow dynamics that enable separation of byproducts from reaction intermediates.

With respect to the above-described embodiments, the deposition chamber is preferably equipped with a vacuum manifold and a pumping system to maintain an appropriate pressure. It is also preferred that the deposition chamber includes a temperature control system, and gas or vapor handling capability to meter and control the flow of reactants and products resulting from the process.

In all of the above-described embodiments, the deposition process typically takes from about 10 seconds to about one hour, most preferably about 10 minutes. However, it will be understood that the time may vary dependent upon the type of film to be deposited, the processing conditions and the desired film thickness.

In one embodiment, under low temperature and low reaction vapor pressure in CVD, pulsed CVD, ALD, SAM, or CCD deposition, and low precursor partial vapor pressure in an inert carrier gas or hydrogen stream, as discussed above, the parent tungsten hexacarbonyl molecule is reliably and controllably converted to the synthon $W(CO)_5$* through the elimination of CO from tungsten hexacarbonyl. The $W(CO)_5$* metastable complex has the capacity to be stable and long-lived (i.e., half-lives consistent with transport time requirements). Further, the $W(CO)_5$* retains CO groups that undergo dissociative adsorption with the substrate, in order to produce high quality W films.

Figure 3:
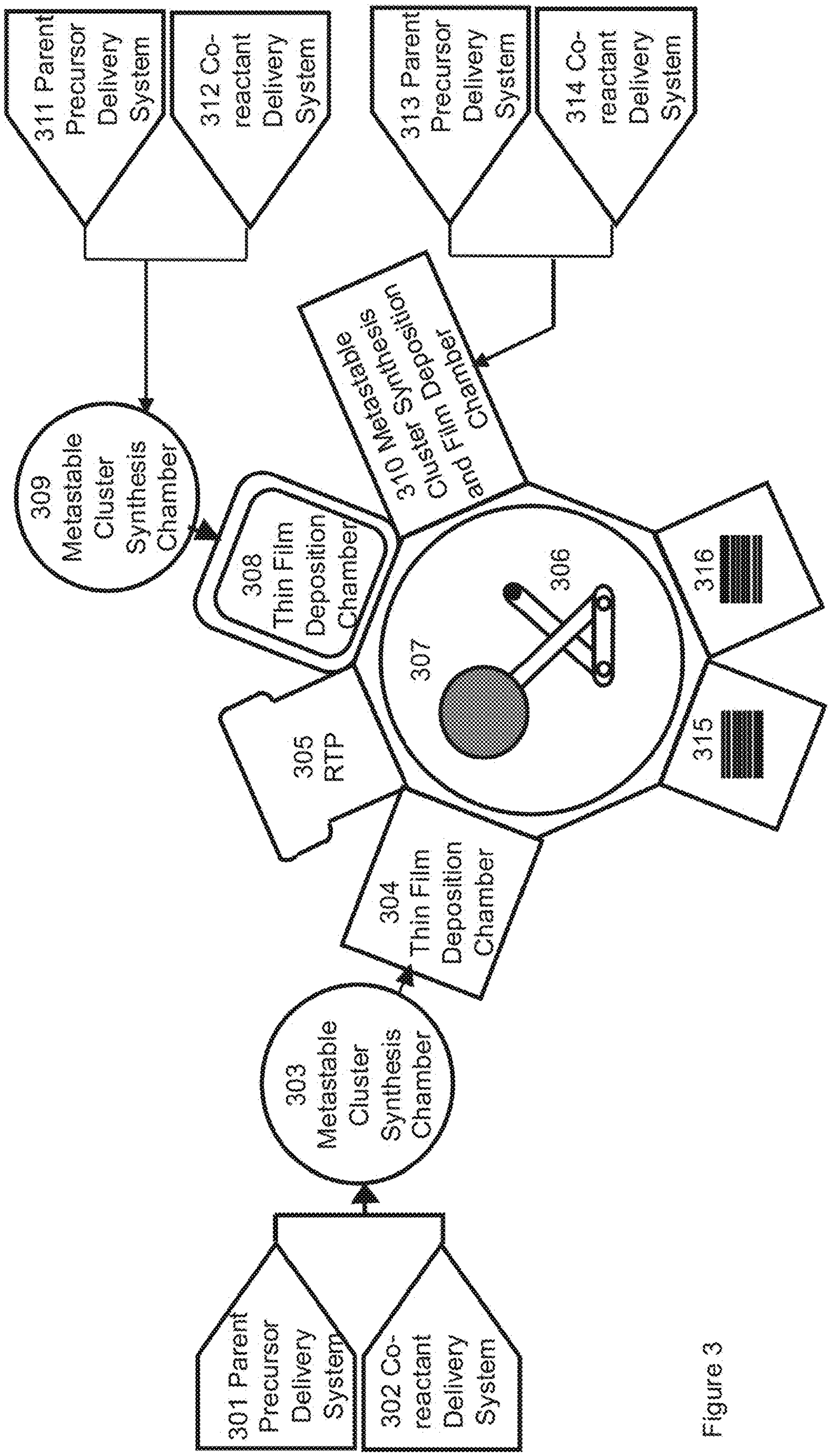
FIG. 3 is a schematic rendering of a manufacturing cluster tool equipped with modules for ex-situ and in-situ synthesis of one or more synthons that are then reacted under CVD, pulsed CVD, ALD, MLD, SAM, or CCD conditions in thin film deposition chambers to form W based thin films on a substrate according to embodiments of the disclosure.

In one embodiment, as shown in FIG. 3, the inventive process may utilize a manufacturing cluster tool equipped with parent precursor delivery systems such 301, 311, and 313; co-reactant (including potentially carrier gas) delivery systems 302, 312, and 314; modules for ex-situ 303 and 309 and in-situ 310 synthesis of the synthons that are then reacted in thin film deposition chambers 304, 308, and 310. The cluster system may also include a central robotic arm 306 for wafer 307 handling; wafer cassette loaders such as 315 and 316; and rapid thermal annealing units such as 305.

The invention will now be described in terms of the following, non-limiting examples.

EXAMPLES

Example 1: Thermal CVD W with In-Situ Synthon Formation

A silicon substrate was introduced into a deposition system. The chamber was subsequently pumped down to a vacuum of $\leq 10^{-6}$ torr using pumping manifold to ensure that the chamber was appropriately purged and evacuated to eliminate any residual atmospheric contaminants. The substrate was then heated to a pre-determined temperature of about 400° C. to about 600° C. and maintained at that temperature for the duration of the W film growth process. The chamber walls were concurrently heated toa pre-determined temperature of about 50° C. to about 250° C. and maintained at that temperature for the duration of the W film growth process. Concurrently, the parent molecule $W(CO)_6$ was introduced into the deposition chamber at a flow of about 50 sccm to form the $W(CO)_5$* synthon. To prevent any undesirable gas phase reactions, the partial pressure of the vapor phase $W(CO)_5$* synthons in the deposition chamber was maintained at about 10 to about 20 Torr. The $W(CO)_5$* synthons subsequently impinge on the substrate where they decompose to yield pure W thin film. The deposition process was halted when the W thin film reached the desired thickness.

Example 2: Thermal ALD W with In-Situ Synthon Formation

A silicon substrate was introduced into a deposition system. The chamber was subsequently pumped down to a vacuum of $\leq 10^{-6}$ torr using a pumping manifold to ensure that the chamber was appropriately purged and evacuated to eliminate any residual atmospheric contaminants. The substrate was then heated to a pre-determined temperature of about 400° C. to about 550° C. and maintained at that temperature for the duration of the W film growth process. The chamber walls were concurrently heated to a pre-determined temperature of about 150° C. to about 250° C. and maintained at that temperature for the duration of the W film growth process. Concurrently, the parent molecule $W(CO)_6$ was pulsed into the deposition chamber at a flow of about 50 sccm to generate the $W(CO)_5$* synthon which adsorbed to the substrate and formed a monolayer of the $W(CO)_5$* synthon on the silicon substrate without reaction with the substrate. To prevent any undesirable gas phase reactions, the partial pressure of the vapor phase $W(CO)_5$* synthons in the deposition chamber was kept at about 1 to about 20 Torr during the cycle. The deposition chamber was then purged with argon at 100 sccm to remove any remaining precursor and byproducts from the reaction zone. A hydrogen pulse was then introduced at 200 sccm to react with the monolayer of the $W(CO)_5$* synthon on the silicon substrate to form a monolayer of W. The deposition chamber was then purged with argon at 100 sccm to remove any remaining hydrogen reactant from the reaction zone. The process was repeated until the desired W film thickness was achieved.

Example 3: Plasma CVD W with In-Situ Synthon Formation

A silicon substrate was introduced into the deposition system. The chamber was subsequently pumped down to a vacuum of $\leq 10^{-6}$ torr using a pumping manifold to ensure that the chamber was appropriately purged and evacuated to eliminate any residual atmospheric contaminants. The substrate was then heated to a pre-determined temperature of about 400° C. to about 550° C. and maintained at that temperature for the duration of the W film growth process. Concurrently, the parent molecule $W(CO)_6$ was introduced into the deposition chamber at a flow of about 50 sccm and a radio frequency (rf) plasma was then ignited and maintained at about 1 $W/cm^2$ to about 5 $W/cm^2$ without heating the deposition chamber walls. The plasma was applied to form the $W(CO)_5$* synthon. To prevent any undesirable gas phase reactions, the partial pressure of the vapor phase $W(CO)_5$* synthons in the deposition chamber was maintained at about 1 to about 10 Torr. The $W(CO)_5$* synthons subsequently impinged on the substrate where they decomposed to yield pure W thin film. The deposition process was halted when the W thin film reached the desired thickness.

Example 4 (Prophetic): Thermal CVD W with Ex-Situ Synthon Formation

A silicon substrate is introduced into the deposition system. The chamber is subsequently pumped down to a vacuum of $\leq 10^{-6}$ torr using pumping manifold to ensure that the chamber is appropriately purged and evacuated to eliminate any residual atmospheric contaminants. The substrate is then heated to a pre-determined temperature of about 400° C. to about 550° C. and maintained at that temperature for the duration of the W film growth process. The chamber walls are concurrently heated to a pre-determined temperature of about 150° C. to about 250° C. and maintained at that temperature for the duration of the W film growth process. Concurrently, the synthesis chamber walls are heated to a pre-determined temperature of about 150° C. to about 250° C. and the parent molecule $W(CO)_6$ is introduced into the synthesis chamber at a flow of about 75 sccm to form the $W(CO)_5$* synthon. To prevent any undesirable gas phase reactions, the partial pressure of the vapor phase $W(CO)_5$* synthons in the synthesis chamber is maintained at about 5 to about 15 Torr. The $W(CO)_5$* synthons are subsequently introduced into the deposition chamber at a partial pressure of the vapor phase $W(CO)_5$* synthons of about 1 to about 10 Torr where they impinge on the substrate and decompose to yield pure W thin film. The deposition process is halted when the W thin film reaches the desired thickness.

Example 5 (Prophetic): Thermal ALD WN with In-Situ Synthon Formation

A silicon substrate is introduced into a deposition system. The chamber is subsequently pumped down to a vacuum of $\leq 10^{-6}$ torr using pumping manifold to ensure that the chamber is appropriately purged and evacuated to eliminate any residual atmospheric contaminants. The substrate is then heated to a pre-determined temperature of about 400° C. to about 550° C. and maintained at that temperature for the duration of the W film growth process. The chamber walls are concurrently heated to a pre-determined temperature of about 150° C. to about 250° C. and maintained at that temperature for the duration of the W film growth process. Concurrently, the parent molecule $W(CO)_6$ is pulsed into the deposition chamber at a flow of about 50 sccm to generate the $W(CO)_5$* synthon which adsorbs to the substrate and forms a monolayer of the $W(CO)_5$* synthon on the silicon substrate without reaction with the substrate. To prevent any undesirable gas phase reactions, the partial pressure of the vapor phase $W(CO)_5$* synthons in the deposition chamber is kept at about 1 to about 5 Torr during the cycle. The deposition chamber is then purged with argon at 100 sccm to remove any remaining precursor and byproducts from the reaction zone. An ammonia pulse is then introduced at 250 sccm to react with the monolayer of the $W(CO)_5$* synthon on the silicon substrate to form a monolayer of WN. The deposition chamber is then purged with argon at 100 sccm to remove any remaining hydrogen reactant from the reaction zone. The process is repeated until the desired WN film thickness is achieved.

Example 6 (Prophetic): Thermal ALD WN with In-Situ Synthon Formation

Under the same conditions as Example 5, tungsten pentacarbonyl triethylamide $W(CO)_5(NEt_3)$ is substituted for tungsten hexacarbonyl.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for depositing a tungsten-based thin film onto a substrate from vapor phase molecular complexes, the method comprising: providing the substrate in a deposition chamber, wherein the deposition chamber has walls; heating the substrate to about 100° C. to about 650° C.; maintaining the substrate at about 100° C. to about 650° C.; providing a synthesis chamber which is distinct from the deposition chamber, wherein the synthesis chamber has walls; connecting the synthesis chamber to the deposition chamber via a vacuum interlock or valving system; heating the walls of the synthesis chamber to about 50° C. to about 500° C.; providing a tungsten source precursor to the synthesis chamber; generating the vapor phase molecular complexes from the tungsten source precursor while maintaining the temperature of the walls of the synthesis chamber walls at about 50° C. to about 500° C.; controlling a concentration or partial pressure of the vapor phase molecular metastable complexes in the synthesis chamber by selection of process parameters using a vacuum, inert gas, or a stabilizing gas to prevent self-reaction of the vapor phase molecular complexes; and delivering the vapor phase molecular complexes to the deposition chamber, where the vapor phase molecular complexes decompose to form the tungsten-based thin film on the substrate by: (a) maintaining the partial pressure of the vapor phase molecular complexes in the deposition chamber at about 1 to about 500 Torr while maintaining the walls of the deposition chamber at about 50° C. to about 350° C.; or (b) maintaining the partial pressure of the vapor phase molecular complexes in the deposition chamber at about 0.01 to about 10 Torr while maintaining the walls of the deposition chamber walls at about 350° C. to about 500° C., wherein the vapor phase molecular complexes are synthesized such that the substrate surface does not contribute to nor catalyze their creation.

2. The method according to claim 1, wherein the tungsten source precursor has a formal tungsten oxidation state of zero.

3. The method according to claim 1, wherein the tungsten source precursor is selected from the group consisting of tungsten hexafluoride ($WF_6$), tungsten hexachloride ($WCl_6$), tungsten pentachloride ($WCl_5$); bis(tert-butylimido)bis(dimethylamido) tungsten [$(tBuN)_2(Me_2N)_2W$]; $W_2(NMe_2)_6$; tris (3-hexyne) tungsten carbonyl [$W(CO)(CH_3CH_2CCCH_2CH_3)_3$]; ethylcyclopentadienyltungsten(V) tricarbonylhydride ($HEtCpW(CO)_3$); tungsten ethoxide $W(OC(OC_2H_5))_6$; a tungsten pentacarbonyl dialkylamide $W(CO)_5NR_2$; and a tungsten pentacarbonyl trialkylamide $W(CO)_5NR_3$.

4. The method according to claim 1, further comprising delivering hydrogen as a co-reactant to the synthesis and/or deposition chamber, optionally in combination with an inert gas.

5. The method according to claim 1, further comprising delivering a nitrogen-containing gas as a co-reactant to the synthesis and/or deposition chamber, optionally in combination with an inert gas.

6. The method according to claim 5, wherein the nitrogen-containing gas is selected from the group consisting of ammonia and hydrogen azide.

7. The method according to claim 1, wherein the method is selected from the group consisting of chemical vapor deposition, atomic layer deposition, molecular layer deposition, self-assembled monolayer deposition, and click chemistry deposition.

* * * * *